United States Patent [19]

Waku et al.

[11] 4,096,452
[45] Jun. 20, 1978

[54] TEMPERATURE COMPENSATED CRYSTAL OSCILLATOR

[75] Inventors: Toshihiko Waku; Hiroshi Shinohara, both of Tokyo, Japan

[73] Assignee: Sony Corporation, Tokyo, Japan

[21] Appl. No.: 793,128

[22] Filed: May 2, 1977

[30] Foreign Application Priority Data

May 13, 1976 Japan .................... 51-59526[U]

[51] Int. Cl.² .............................................. H03B 5/36
[52] U.S. Cl. .............................. 331/116 R; 331/176; 331/177 V
[58] Field of Search ............... 331/116 R, 176, 177 V, 331/36 C; 334/15

[56] References Cited

U.S. PATENT DOCUMENTS

| | | | |
|---|---|---|---|
| 3,404,297 | 10/1968 | Fewings et al. | 331/116 |
| 3,454,903 | 7/1969 | Page | 331/116 |
| 3,970,966 | 7/1976 | Keller | 331/116 |
| 4,051,446 | 9/1977 | Owaki | 331/116 |

Primary Examiner—John Kominski
Attorney, Agent, or Firm—Hill, Gross, Simpson, Van Santen, Steadman, Chiara & Simpson

[57] ABSTRACT

A temperature-compensated crystal oscillator for correcting frequency variations caused by temperature changes by means of a differential amplifier which detects an unbalanced voltage in a bridge circuit including a temperature sensitive element for controlling a capacitance of a variable capacitor. The oscillator includes a circuit element having a temperature characteristic responsive to a temperature characteristic of the variable capacitor. The aforesaid circuit element is positioned in a current sink path of the differential amplifier.

11 Claims, 5 Drawing Figures

TEMPERATURE COMPENSATED CRYSTAL OSCILLATOR

BACKGROUND OF THE INVENTION

1. Field of the Invention

This invention relates to temperature compensating arrangements for correcting frequency variations due to temperature changes in systems employing crystal oscillators.

2. Description of the Prior Art

Hitherto, a crystal oscillator has been widely used as a circuit for deriving a signal of a constant frequency. However, for achieving a signal of such constant frequency, it is required to compensate a temperature characteristic of a crystal. Two methods for compensating the aforesaid temperature characteristic are known, i.e., (i) one to place a crystal in a thermostatic oven while controlling a heater current of the oven so as to maintain the temperature of the oven constant, and (ii) to add a capacitance of a variable capacitor, such as a variable capacitance diode, to a crystal for controlling a capacitance in response to temperature changes so as to maintain a constant oscillating frequency.

According to the second case there is used a differential amplifier which detects an unbalanced voltage produced due to a temperature change by use of a bridge circuit including a temperature sensitive element such as a thermistor. The capacitance of a variable capacitor is then controlled according to an output voltage thus detected for temperature compensation of an oscillation frequency. However, the aforesaid variable capacitor has a temperature characteristic which affords an extremely narrow range of approximate linearity, so that temperature compensation only remains possible in an extremely narrow range.

SUMMARY OF THE INVENTION

It is an object of the present invention to provide a temperature-compensated crystal oscillator which corrects frequency variations due to temperature changes by means of a differential amplifier which detects an unbalanced voltage in a bridge circuit including a temperature sensitive element for controlling a capacitance of a variable capacitor.

It is another object of the present invention to provide a temperature-compensated crystal oscillator which oscillates at a constant frequency over a wide temperature range. It is a further object of the present invention to provide a temperature-compensated crystal oscillator which allows a wide range temperature compensation by using both a thermistor which compensates the temperature of a crystal and a diode which compensates the temperature of a variable capacitor.

It is a still further object of the present invention to provide a temperature-compensated crystal oscillator which includes two or more bridge circuits each having two or more temperature sensitive elements having different operational temperature ranges, and two or more differential amplifiers, with portions of the respective bridge circuits and portions of circuit elements of respective differential amplifiers being used in common, respectively.

It is a yet further object of the present invention to provide a temperature-compensated crystal oscillator which allows a wide range of temperature compensation with a simple circuit arrangement.

According to the invention, a temperature-compensated crystal oscillator is provided having an oscillator circuit with a crystal and an electronically controlled variable capacitance. A differential amplifier having first and second transistors connects to the oscillator circuit, preferably through a high frequency choking element. A bridge circuit is connected to inputs of the differential amplifier so as to supply a biasing voltage to the first and second transistors. This bridge circuit includes a temperature sensing element in one of its branches. A temperature compensation memeber is connected to the differential amplifier and has a temperature characteristic which compensates a temperature characteristic of the variable capacitance in the oscillator circuit. A compensating member may be embodied as diodes in the collector-emitter current paths of the transistors in the differential amplifier. Alternatively, the compensating member may be other transistor in series with the transistors of the differential amplifier wherein this additional transistor is controlled by a temperature sensitive device. Or, in another embodiment, the compensation member may be an additional transistor connected to and parallel with the differential amplifier which forms a second differential amplifier in conjunction with one of the transistors in the first differential amplifier.

The above objects and features of the temperature-compensated crystal oscillator according to the present invention will be apparent from the following detailed description of the preferred embodiments in conjunction with the accompanying drawings.

DESCRIPTION OF THE PREFERRED EMBODIMENTS

The present invention will now be described in more detail with reference to the accompanying drawings which indicate the embodiments of the invention.

Figure 1:
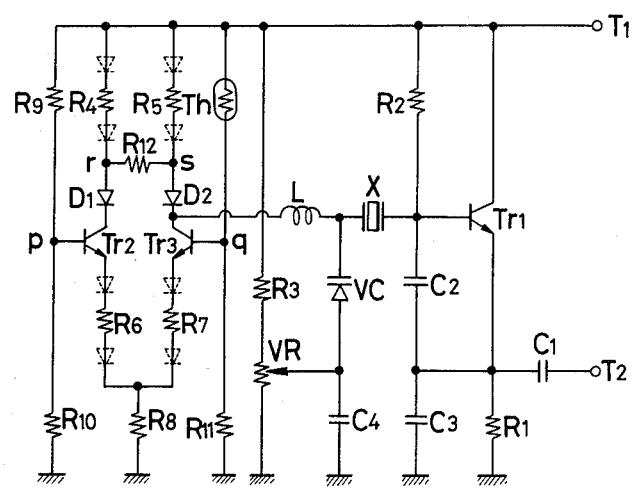
FIG. 1 is a circuit diagram representing a first embodiment of the temperature-compensated crystal oscillator according to the present invention.

Referring to FIG. 1, there is shown a circuit diagram representing one embodiment of the invention. An oscillating transistor Tr1 has a collector electrode connected to a power source terminal T1 and an emitter electrode grounded via a resistor R1 and connected via a capacitor C1 to a signal output terminal T2. The oscillating transistor Tr1 further has a base electrode connected via resistor R2 to the power source terminal T1. The base is also grounded through a series circuit consisting of capacitors C2, C3 and via crystal X through a series circuit consisting of a variable capacitance, i.e., a variable capacitance diode VC, and a capacitor C4.

A junction of the capacitors C2 and C3 is connected to an emitter electrode of the transistor Tr1. In addition, the variable capacitance diode VC has a cathode connected to the crystal X and to a collector electrode of a second transistor TR3 in a differential amplifier (to be described later), via a high-frequency-choking coil L.

The diode VC further has an anode grounded via the capacitor C4 and which also is connected to a sliding terminal of a variable resistor VR at one end. Meanwhile, the variable resistor VR is connected via a resistor R3 to the power source terminal T1 at the other end.

A differential amplifier consists of first and second transistors Tr2, Tr3. The first and second transistors Tr2, Tr3 have: collector electrodes connected via series circuits of a diode D1 and a resistor R4, and a diode D2 and a resistor R5, respectively, to the power source terminal T1; emitter electrodes grounded via series circuits of a resistor R6 and a resistor R8, and a resistor R7 and the resistor R8, respectively; and base electrodes connected to a junction of resistor R9 and resistor R10, and to a junction of a temperature sensitive element Th having a negative temperature coefficient, for example, such as a thermistor, and a resistor R11, respectively. In this respect, the diodes D1, D2 have temperature characteristics responsive to the temperature characteristic of the variable capacitance diode VC and have anodes connected to each other via a resistor R12.

With the aforesaid circuit arrangement, an operating point of the variable capacitance diode VC is governed by adjusting the variable resistor VR, while its output capacitance is controlled by a collector voltage of the second transistor Tr3 in the differential amplifier. In the aforesaid differential amplifier, if the temperature is maintained constant, then a potential difference (unbalanced voltage in the bridge circuit) between a point P (a junction of the resistors R9 and R10) in a bridge circuit consisting of a temperature sensitive element Th and resistors R9, R10, R11, and a point $q$ (a junction of the element Th and the resistor R11) may be maintained constant, and in addition a potential difference between a point $r$ and a point S on the anode sides of respective diodes D1, D2 may also be maintained constant. Consequently, a collector voltage in the second transistor Tr3 is maintained constant and an output capacitance of the variable capacitance diode VC may be controlled to be constant. On the other hand, when a temperature is changed, and hence an oscillation frequency of a crystal oscillator is changed due to a temperature characteristic of the crystal X, then a resistance of the temperature sensitive element Th having a temperature characteristic responsive to the temperature characteristic of the crystal is changed so that a potential at a point $q$ in the bridge circuit is changed. Hence, a collector voltage at the second transistor Tr3 in the aforesaid differential amplifier is changed thereby controlling an output capacitance of the variable capacitance diode VC so as to compensate for variations in the oscillating frequency. The extent of variation in collector voltage for controlling the aforesaid output capacitance is adjusted by selecting a resistance of the resistor R12 commensurate to the temperature characteristic of the crystal X. In this respect, in general there results incomplete compensation of the aforesaid oscillation frequency over a wide temperature range due to a temperature characteristic of the variable capacitance diode VC. However, according to the present invention, diodes D1 and D2 having temperature characteristics responsive to the temperature characteristic of the variable capacitance diode VC are connected to the collector sides of the first and second transistors Tr2, Tr3, so that a collector voltage at the second transistor Tr2 varies due to the element Th having a temperature characteristic responsive to the temperature characteristic of the crystal X and due to the respective diodes D1, D2 having temperature characteristics responsive to the temperature characteristic of the variable capacitance diode VC. As a result, the temperature characteristic of the variable capacitance diode VC may be compensated for by the circuit of the aforesaid arrangement so that there may be derived a signal of a constant frequency over a wide temperature range at all times.

Figure 2:
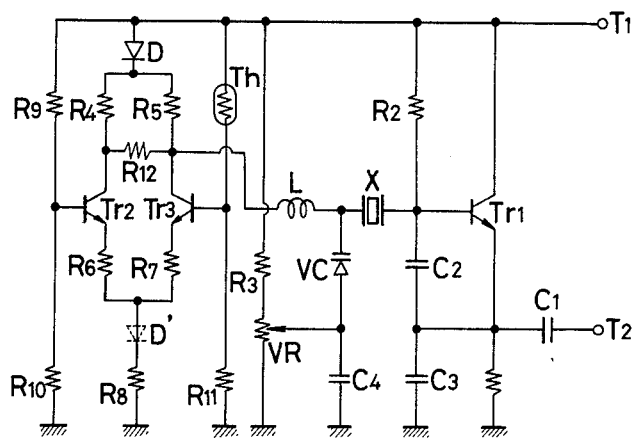
FIG. 2 is a circuit diagram representing a second embodiment of the temperature-compensated crystal oscillator according to the present invention.

As shown by a solid line or a broken line in FIG. 2, in case a diode D' or D is interposed between a junction of the resistor R6 to the resistor R7 and the ground, or between a junction of transistor R4 to resistor R5 and the power source terminal T1, then a single diode suffices for compensating the temperature characteristic of the variable capacitance diode VC.

According to the present invention, a diode for compensating the temperature characteristic of the variable capacitance diode may be positioned anywhere in a collector current path of the first and second transistors in the differential amplifier. (This path is referred to as a current sink path.)

Figure 3:
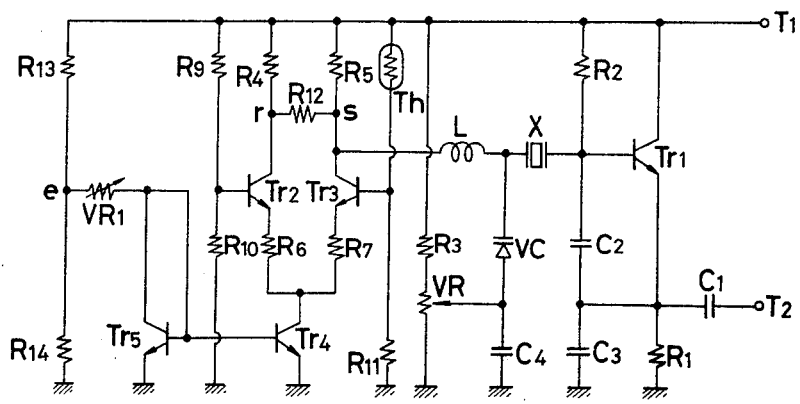
FIG. 3 is a circuit diagram representing a third embodiment of the temperature-compensated crystal oscillator according to the present invention.

While a description has been presented of the embodiments with reference to a diode adapted to compensate the temperature characteristic of a variable capacitance diode, any circuit element may be used in place of the diode so long as the circuit element has a temperature characteristic responsive to the temperature characteristic of the variable capacitance diode. FIG. 3 shows one embodiment wherein transistors are used for this purpose. In FIG. 3, a collector electrode and emitter electrode of the transistor Tr4 are connected between a junction of the resistors R6, R7 and the ground, while a base electrode of the transistor Tr4 is grounded via the base-emitter of the transistor Tr5 and connected via a series circuit consisting of variable resistor VR1 and a resistor R13 to the power source terminal T1. In this respect, one end of the variable resistor VR1 is grounded via the resistor R14, and the other end of the resistor VR1 is connected to a collector electrode of the transistor Tr5. Meanwhile, circuit elements other than those referred to above are the same those given in the aforesaid embodiment, and thus designated with like reference numerals in FIG. 3, and description thereof is omitted.

With the circuit of the aforesaid arrangement, a current I (a sink current in a differential amplifier) which flows across the collector-emitter path of the transistor Tr4 is given as follows:

$$I = \frac{Ve - VBe}{R}$$

where Ve represents a potential at a junction $e$ between resistors R13 and R14; VBe represents a base-emitter voltage at transistors Tr4, Tr5; and R represents a resistance of the variable resistor VR1.

Assuming that resistances of resistors R4, R5 are equal to Ro, then potentials Vr, Vs at the points $r$ and $s$ are given as follows:

$$Vr = Vs = \frac{1}{2} Ro \cdot I = \frac{Ro}{2R} (Ve - VBe).$$

For varying a voltage impressed on a cathode of the variable capacitance diode VC by a value (voltage) α, when a base-emitter voltage at the transistors Tr4, Tr5 having temperature characteristics responsive to the temperature characteristic of the variable capacitance diode VC is varied by a value α due to temperature changes, resistances Ro, R of the resistors R13, R14 and variable resistor Vr1 should be determined as so to satisfy the following equation:

$$\frac{Ro}{2R} (Ve - VBe - \alpha) - \frac{Ro}{2R} (Ve - VBe) = -\alpha$$

Stated differently, if respective resistances are determined so as to satisfy Ro = 2R, then the temperature characteristic with respect to a backward voltage of the variable capacitance diode may be compensated due to the temperature characteristics of the base-emitter voltages of the transistors Tr4, Tr5.

Figure 4:
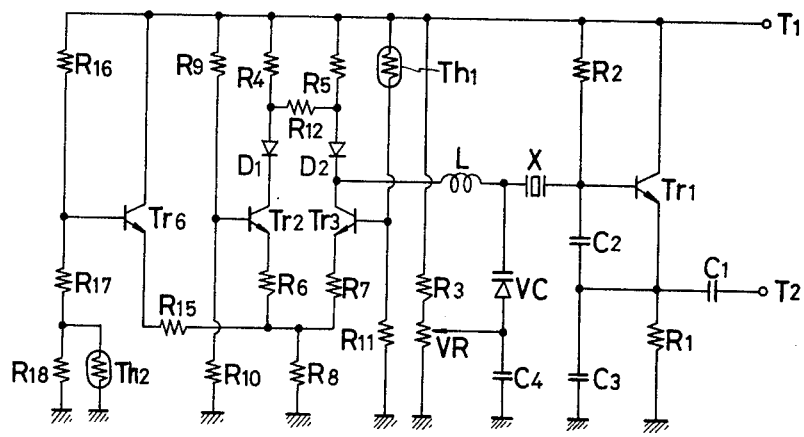
FIG. 4 is a circuit diagram representing a fourth embodiment of the temperature-compensated crystal oscillator according to the present invention.

FIG. 4 shows still another embodiment wherein temperature compensation is made over a wide temperature range by using two or more bridge circuits, each of which includes two or more temperature sensitive elements, in addition to two or more differential amplifiers, with respective parts of the bridge circuits and differential amplifiers being used in common.

In this embodiment, a first differential amplifier consists of a transistor Tr2 and a transistor Tr3, while a second differential amplifier consists of the transistor Tr2 and a transistor Tr6. In other words, the first and second differential amplifiers include the transistor Tr2 in common. In addition, a first bridge circuit consists of first, second, third and fourth circuit elements, i.e., a resistor R9, resistor R10, a first temperature sensitive element Th1 (as shown in FIG. 1), and a resistor R11, while a second bridge circuit consists of first, second, third and fourth circuit elements, i.e., a resistor R9, resistor R10, resistor R16, resistor R17, and a parallel circuit consisting of a resistor R18 and a second temperature sensitive element Th2. In other words, the first and second bridge circuits commonly include the resistors R9 and R10 as the first and second circuit elements.

Meanwhile, the first element Th1 has a temperature characteristic such that its resistance varies linearly relative to temperature changes, while the second element Th2 has a temperature characteristic such that its resistance varies exponentially relative to temperature changes. In addition, the aforesaid elements Th1, Th2 having different operation temperature ranges are used, and a circuit constant is so determined that the transistor Tr6 may be brought to an OFF condition in a temperature range above 0° C, and the transistor Tr6 may be brought to an ON condition in a temperature range below 0° C.

In other words, with the aforesaid embodiment, when an ambient temperature is above 0° C (or below 0° C), a resistance of the second temperature sensitive element Th2 is reduced (or increased), so that the transistor Tr6 is brought to an OFF condition (or an ON condition). At this time, a resistance of the first temperature sensitive element Th1 is increased, (or reduced), while the transistors Tr2, Tr3 are brought to ON conditions.

Figure 5:
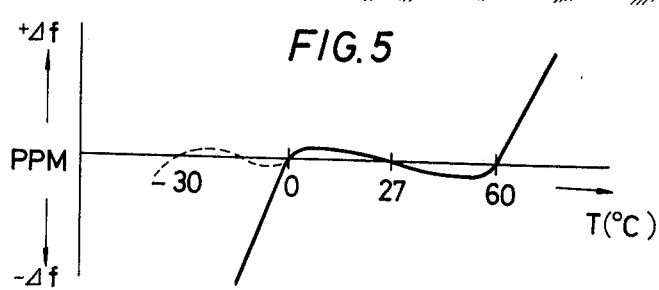
FIG. 5 is a theoretical curve illustrating the temperature-frequency characteristic of a temperature-compensated oscillator arranged according to the fourth embodiment of FIG. 4.

Accordingly, when an ambient temperature is above 0° C, then an unbalanced voltage in the first bridge circuit including the first element Th1 is detected by the first differential amplifier, and then the capacitance of the variable capacitance diode VC is controlled according to an output voltage thus detected thereby compensating the oscillating frequency of the crystal oscillator so as not change due to temperature changes. On the other hand, when an ambient temperature is below 0° C, then a current flowing through the transistor Tr3 changes due to current changes of the transistor Tr6 including the second element Th2, and then the capacitance of the variable capacitance diode VC is controlled due to the detected output voltage of the transistor Tr3, thereby compensating the oscillation frequency of the crystal oscillator so as not to change due to temperature changes. More specifically, as shown in FIG. 5, the temperature compensation (shown by a solid line) is accomplished by the first element Th1 when an ambient temperature is above 0° C, while the temperature compensation (shown by a broken line) is accomplished by the second element when an ambient temperature is below 0° C.

With the aforesaid embodiment, the first element Th1 provides the temperature compensation in a temperature range of 0° C to 60° C, while the second element Th2 provides the temperature compensation in a temperature range of −30° C to 0° C. However, a temperature range should not necessarily be limited to this range. The circuit arrangement other than those described as above remains the same as those of the other embodiments, so that like reference numerals are designated, and hence the description is omitted.

Although various minor modifications may be suggested by those versed in the art, it should be understood that we wish to embody within the scope of the patent warranted hereon, all such embodiments as reasonably and properly come within the scope of our contribution to the art.

We claim as our invention:

1. A temperature-compensated crystal oscillator, comprising:
    an oscillator circuit having a crystal and a variable capacitance;
    a differential amplifier comprising first and second transistors establishing a current sink path;
    connecting means for connecting said differential amplifier to said oscillator;
    bridge circuit means connected to said differential amplifier so as to supply a biasing voltage to said first and second transistors, said bridge circuit means including a first temperature sensitive element; and
    compensation means connected to said current sink path of said differential amplifier having a temperature characteristic which compensates a temperature characteristic of said variable capacitance.

2. A temperature-compensated crystal oscillator as defined in claim 1, wherein said compensation means is a diode which is connected in a collector electrode path of said first and second transistors.

3. A temperature-compensated crystal oscillator as defined in claim 1, wherein said compensation means comprises diodes, a diode being connected to each collector electrode of said first and second transistors.

4. A temperature-compensated crystal oscillator as defined in claim 1, wherein said compensation means comprises diodes, a diode being connected to an emitter electrode of each of said first and second transistors.

5. A temperature-compensated crystal oscillator as defined in claim 1, wherein the compensation means comprises a third transistor which is connected in series with said differential amplifier, a fourth transistor whose base electrode connects to a base electrode of said third transistor, and a biasing circuit connected to said third and fourth transistors.

6. A temperature-compensated crystal oscillator as defined in claim 1, wherein said oscillator further comprises: an additional transistor whose collector and emitter paths are connected in parallel to said first and second transistors, and a biasing circuit connected to said additional transistor for supplying a biasing voltage to said additional transistor and having a second temperature sensitive element, said first and second temperature sensitive elements having different temperature characteristics, respectively.

7. A temperature-compensated crystal oscillator as defined in claim 6, wherein said first temperature sensitive element has a linear temperature characteristic, and said second temperature sensitive element has an exponential function characteristic.

8. A temperature-compensated crystal oscillator as defined in claim 1, in which said oscillator variable capacitance comprises a variable capacitance diode.

9. A temperature-compensated crystal oscillator, comprising:
   an oscillator circuit including a crystal and an electronically controlled variable capacitance means for varying a frequency of said oscillator circuit;
   a differential amplifier comprising first and second transistors connected to said variable capacitance means;
   bridge circuit means including a first temperature sensitive element connected to said differential amplifier for supplying a bias voltage thereto; and
   compensation means connected to said differential amplifier having a temperature characteristic related to a temperature characteristic of said variable capacitance means.

10. The oscillator of claim 9 in which said compensation means is connected in series with a collector-emitter path of at least one of the transistors in the differential amplifier.

11. The oscillator of claim 9 in which said compensation means is connected in parallel with said differential amplifier.

* * * * *